(12) United States Patent
Kürten et al.

(10) Patent No.: US 12,444,671 B2
(45) Date of Patent: Oct. 14, 2025

(54) SEMICONDUCTOR COMPONENT WITH DAMPED BONDING SURFACES IN A PACKAGE WITH ENCAPSULATED PINS

(71) Applicant: Siemens Aktiengesellschaft, Munich (DE)

(72) Inventors: Bernd Kürten, Obermichelbach (DE); Daniel Kappauf, Gräfenberg (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 18/705,273

(22) PCT Filed: Sep. 27, 2022

(86) PCT No.: PCT/EP2022/076838
§ 371 (c)(1),
(2) Date: Apr. 26, 2024

(87) PCT Pub. No.: WO2023/072510
PCT Pub. Date: May 4, 2023

(65) Prior Publication Data
US 2024/0429144 A1      Dec. 26, 2024

(30) Foreign Application Priority Data
Oct. 28, 2021    (EP) ..................................... 21205313

(51) Int. Cl.
*H01L 23/498*    (2006.01)
*H01L 21/48*     (2006.01)
(Continued)

(52) U.S. Cl.
CPC .... *H01L 23/49811* (2013.01); *H01L 21/4853* (2013.01); *H01L 21/54* (2013.01);
(Continued)

(58) Field of Classification Search
CPC ........... H01L 23/49811; H01L 21/4853; H01L 24/85; H01L 23/49861; H01L 24/45;
(Continued)

(56) References Cited

U.S. PATENT DOCUMENTS 5,920,119 A * 7/1999 Tamba .................. H01L 25/072
257/726
2008/0217760 A1   9/2008 Yoshihara et al.
(Continued)

FOREIGN PATENT DOCUMENTS

DE    10 2008 012 703 A1    9/2008
DE    10 2019 217 489 A1    5/2020
(Continued)

OTHER PUBLICATIONS

PCT International Search Report and Written Opinion of International Searching Authority mailed Jan. 26, 2023 corresponding to PCT International Application No. PCT/EP2022/076838 filed Sep. 27, 2022.

*Primary Examiner* — Sonya McCall-Shepard
(74) *Attorney, Agent, or Firm* — Henry M. Feiereisen LLC (57) ABSTRACT

A housing part for accommodating a semiconductor element includes a pin partially molded in the housing part for electrical connection to a printed circuit board. The pin includes a bonding surface for producing an electrical connection between the pin and the semiconductor element. The housing part includes a bearing surface for the bonding surface and a recess formed in the bearing surface or adjoining the bearing surface. A vibration-damping material is at least partially filled in the recess and/or applied in a region adjoining the recess. The housing part is designed as a one-piece housing frame part.

20 Claims, 4 Drawing Sheets

(51) Int. Cl.

| | |
|---|---|
| *H01L 21/54* | (2006.01) |
| *H01L 23/00* | (2006.01) |
| *H01L 23/053* | (2006.01) |
| *H01L 23/10* | (2006.01) |
| *H01L 23/24* | (2006.01) |
| *H01L 25/07* | (2006.01) |
| *H01L 25/18* | (2023.01) |
| *H10D 12/00* | (2025.01) |
| *H10D 30/60* | (2025.01) |
| *H10D 62/832* | (2025.01) |

(52) U.S. Cl.
CPC ............ *H01L 23/053* (2013.01); *H01L 23/24* (2013.01); *H01L 24/85* (2013.01); *H01L 2224/858* (2013.01); *H10D 12/411* (2025.01); *H10D 30/60* (2025.01); *H10D 62/8325* (2025.01)

(58) Field of Classification Search
CPC ........... H01L 24/48; H01L 2224/73265; H01L 24/49; H01L 2224/48227; H01L 2224/48472; H01L 2224/4911; H01L 2224/85205; H01L 25/072; H01L 2224/48139; H01L 23/10; H01L 23/043; H01L 23/053; H01L 2924/171; H01L 2924/1711; H01L 2924/1715; H01L 2924/173

See application file for complete search history.

(56) References Cited

U.S. PATENT DOCUMENTS

| | | | |
|---|---|---|---|
| 2012/0001309 A1* | 1/2012 | Soyano | ................ H01L 24/49 257/E23.051 |
| 2016/0254215 A1* | 9/2016 | Sato | .................... H01L 21/52 257/668 |
| 2020/0161145 A1 | 5/2020 | Mafune | |
| 2021/0082780 A1 | 3/2021 | Takizawa | |

FOREIGN PATENT DOCUMENTS

| | | |
|---|---|---|
| DE | 11 2018 002 287 T5 | 2/2021 |
| EP | 3863045 A1 * | 8/2021 |

* cited by examiner

SEMICONDUCTOR COMPONENT WITH DAMPED BONDING SURFACES IN A PACKAGE WITH ENCAPSULATED PINS

CROSS-REFERENCES TO RELATED APPLICATIONS

This application is the U.S. National Stage of International Application No. PCT/EP2022/076838, filed Sep. 27, 2022, which designated the United States and has been published as International Publication No. WO 2023/072510 A1 and which claims the priority of European Patent Application, Serial No. 21205313.6, filed Oct. 28, 2021, pursuant to 35 U.S.C. 119 (a)-(d).

BACKGROUND OF THE INVENTION

As a rule, housings for semiconductor components comprise a plurality of housing parts, for example a housing base plate (bottom plate), one or more housing frame part(s) and a housing lid. As a rule, the individual housing parts are glued together, so a semiconductor element, for example an integrated circuit, or a plurality of semiconductor elements in the interior of the housing is or are completely surrounded by the housing.

As a rule, semiconductor components (transistors, triacs, thyristors, diodes, etc.) are applied to a printed circuit board, in particular are soldered to it. For establishing electrical contact, a semiconductor component has, as a rule, electrical contacts, known as pins, led from the housing interior to the outside.

A plurality of semiconductor components of this kind is frequently wired together in order to fulfil a particular purpose. They form an electronic subassembly, for example a converter.

Inside the housing for a semiconductor element there is, as a rule, an electrical connection between bonding surfaces of the pins and bonding surfaces of the semiconductor element by way of wire bonding. A common method is ultrasonic wire bonding in which the bonding surfaces and the bonding wire are welded together by pressure and ultrasonic vibrations.

In order to achieve particular material properties, plastics used for injection molding can be enriched, i.e. "filled", by way of additives or fillers, for example particles. It is thus customary that plastic housings produced, for example, by injection molding for semiconductor components are "filled" with a fairly high content of inorganic particles and glass fibers as filler.

A higher filling content makes the housings more resistant to high temperatures on the one hand, but, on the other hand, also makes them harder, and this is not always desirable.

There are various options for introducing the pins into a housing. One variant provides that recesses are provided in a housing part, in particular a first housing frame part, into which recesses the pins are then inserted. For securing the pins and for embodying bearing surfaces underneath the bonding surfaces of the pins, a second housing frame part is subsequently glued to the first housing frame part, so the pins are secured and fixed in the housing. In this connection it is possible to arrange for glue to be situated underneath the bonding surfaces of the pins in order to form the bearing surfaces for the bonding surfaces, and this has a vibration-damping effect in the case of ultrasonic wire bonding.

This approach is relatively expensive, however, since two housing frame parts have to be manufactured and glued together for one housing. In addition, the pins have to be inserted in the recesses provided for this purpose only after manufacture of the first housing frame part, and this entails an additional work step during production.

It is therefore simpler and thus less expensive to encapsulate the pins with plastic material directly during production of the housing part, in particular in an injection molding method, so the pins are partially molded in the housing part directly during production of the housing parts and are thus connected to the housing part. Appropriate bearing surfaces for the bonding surfaces of the pins are also produced in the same operation and with the same (injection molding) material.

In addition to the advantages already mentioned, this approach does have the drawback, however, that, in particular in the case of a housing material with a high filler content, the bonding surfaces of the pins are excited to undesirable vibrations (resonances) in the case of ultrasonic wire bonding, so the desired welded joint between the bonding wire and the bonding surface is not achieved or is not achieved in the required quality.

From DE102008012703A1 a semiconductor apparatus and method for producing the same are known in which an improved housing structural order is created which can be flexibly adjusted to an different apparatus models and specification in that it uses an external synthetic resin housing of a semiconductor apparatus as a shared component. In a semiconductor apparatus, an external synthetic resin housing is combined with a substrate arrangement made of a heat-dissipating metal carrier, an insulating printed circuit board and a semiconductor chip, wherein L-shaped leg parts of external connecting terminals arranged in the wall of the external synthetic resin housing are drawn into the interior of the housing and contacting wires connect the connecting terminal leg parts to a conductor pattern of the insulating printed circuit board, a large number of connecting terminal securing holes are formed in advance in the peripheral wall of the external synthetic resin housing by casting and external connecting terminals are attached for assembly in the required connecting terminal securing holes.

It is an object of the present invention to make high-quality ultrasonic welded joints easily and inexpensively possible in a housing part with molded-in (encapsulated) pins.

SUMMARY OF THE INVENTION

This object is achieved by a housing part for accommodating a semiconductor element,
  wherein the housing part comprises at least one pin partially molded in the housing part for electrical connection to a printed circuit board,
  wherein the pin comprises a bonding surface for producing an electrical connection between the pin and the semiconductor element,
  wherein the housing part comprises a bearing surface for the bonding surface and wherein the housing part has a recess in the bearing surface or adjoining the bearing surface and
  wherein the recess is at least partially filled with a vibration-damping material and/or vibration-damping material is applied in a region adjoining the recess.

The inventive housing part can be produced easily and inexpensively by way of the molded-in (encapsulated) pins. Furthermore, the bearing surfaces for the bonding surfaces are made from the same housing material and they are produced in the same manufacturing step together with the rest of the housing part. In particular, it is not necessary to produce two separate housing frame parts or to connect them together by means of a glued joint.

The bearing surface is decoupled mechanically or in terms of vibrations from the rest of the housing frame part by the introduction of at least one recess in or adjoining a bearing surface. Filling the recesses with vibration-damping material or applying vibration-damping material in a region adjoining the recess also damps undesirable vibrations, in particular resonances. In particular, undesirable vibrations are damped or suppressed to the extent that the desired quality of the welded joints is achieved in the case of ultrasonic wire bonding.

One embodiment of the invention provides that the recess is embodied as a groove between the bearing surface and the rest of the housing part. The recess or groove is preferably allowed for in the construction of the housing part, so it is made directly during production of the housing part, in particular in an injection molding procedure. Alternatively it would also be conceivable to produce the recess or groove in an operation following the injection molding procedure, for example by way of a material-removing method.

The groove effects a narrowing of the material thickness (narrow point) of the housing part in the region of the groove, whereby the bearing surface is elastically deformably connected to the rest of the housing part or the bearing surface is largely decoupled mechanically or in terms of vibrations from the rest of the housing part.

In general, a recess effects reduced rigidity and, accompanying this, improved elasticity due to the reduction in material.

At least partially filling the recess or groove with a vibration-damping, in particular compared to the housing material, relatively soft or elastic material, means vibrations or resonances transferred to the bonding surface are thus damped in the case of the ultrasonic welding process.

In addition or as an alternative to filling the recess or groove, the vibration-damping material can also be applied in a region adjoining the recess or groove, outside of the recess or groove. By way of example, the vibration-damping material can be introduced into a gap between the bearing surface and a bottom plate in a region directly adjoining the groove.

Advantageously, the vibration-damping effect can be influenced or "adjusted" via the quantity of applied vibration-damping material, in particular via the layer thickness.

Glue (adhesive) is preferably used as the vibration-damping material. Advantageously, the glue can be applied in the same operation in which the glue for connecting the housing part to a semiconductor carrier, in particular a bottom plate, is applied to the housing part. Advantageously, the two functions (gluing and damping) can be fulfilled with the same glue.

One embodiment of the invention provides that the bonding surface is embodied at one end of the pin and, between the bonding surface and a contact surface arranged at the opposing end of the pin, the pin has a bend of at least approximately 90°. This embodiment is customary in semiconductor components in which the pins are led out of the housing at the upper or lower side (and not laterally). This embodiment provides the option of a force, exerted onto the bonding surface from above, being introduced into the housing part deflected by 90°. No additional installation space is thus required in the housing part for the groove and the damping material.

With semiconductor components it is customary that the housing part does not have just one pin but a plurality of pins arranged directly side by side, each with a bonding surface and a bearing surface.

One embodiment of the invention provides that adjacent bearing surfaces, which are provided with at least one recess and vibration-damping material respectively, are separated from one another by a gap respectively. While a vibration-damping effect is also achieved even when adjacent bearing surfaces are not separated from one another by a gap, the vibration-damping effect can be increased in that adjacent bearing surfaces are separated from one another by a lateral gap between the bearing surfaces. Bearing surfaces configured in this way can thus absorb undesirable vibrations even more effectively.

One embodiment of the invention provides that the housing material features a plastic, in particular epoxy resin, reinforced ("filled") with a filler, in particular glass fibers and/or particles, or features a plastic, in particular epoxy resin, reinforced with a filler, in particular glass fibers and/or particles. Housing parts having high thermal stability and which can be produced in an injection molding procedure can be manufactured in this way.

The invention can be applied in a large number of different semiconductor components, for example Insulated-Gate Bipolar Transistors, which are distinguished by an inventive housing part. The invention is particularly advantageous in Wide Band Gap semiconductors, in particular SiC MOSFETs, since especially temperature-resistant, and therewith less elastic or brittle, housings are required in particular in these semiconductors.

The object stated in the introduction is also achieved by a method with the method steps as claimed in claim 9, i.e. a method for producing a housing part for accommodating a semiconductor element, wherein at least one pin for electrical connection to a printed circuit board is at least partially molded in the housing part, wherein a bonding surface for producing an electrical connection between the pin and the semiconductor element is embodied on the pin, wherein a bearing surface for the bonding surface is embodied on the housing part, wherein a recess is embodied in the housing part in the bearing surface or adjoining the bearing surface and wherein the recess is at least partially filled with a vibration-damping material and/or vibration-damping material is applied in a region adjoining the recess.

The advantages of the inventive method are that semiconductor components can be produced with a small number of different housing parts and a small number of manufacturing steps and despite a high filler content in the housing material, high-quality bonds can be reliably produced. In particular, undesirable resonances during bonding are suppressed in the production method.

Advantageous embodiments of the inventive method provide that the recess is embodied as a groove, that the recess is produced in an injection molding method during production of the housing part or that a vibration-damping material, in particular an adhesive, is introduced or is applied in the recess or in a region adjoining the recess.

The formation of a groove can be produced by way of the injection molding method directly during production of the housing part. The adhesive as a vibration-damping material can be introduced or applied in connection with an application of glue to the housing part which is required in any case. No additional method steps are required for said measures therefore.

In particular, the semiconductor element is advantageously applied to a semiconductor carrier, for example a bottom plate made of copper, and an adhesive applied to the housing part for connecting the semiconductor carrier to the housing part, with the adhesive being introduced into the recess or applied in the region of the recess preferably in the same operation, and with the semiconductor carrier being glued in the housing part by means of the adhesive.

Advantageously, in connection with the invention the semiconductor element has a semiconductor bonding surface and the bonding surface (of the pin) and the semiconductor bonding surface are connected or welded together by means of wire bonding, in particular ultrasonic wire bonding.

The invention makes it possible to achieve high-quality bonds, even in the case of relatively hard and inelastic housing parts with a higher filler content, without additional working steps being required for this.

The object stated in the introduction is also achieved by a semiconductor component as claimed in claim 7, comprising a housing part for accommodating a semiconductor element as claimed in one of claims 1 to 6 and a semiconductor element.

BRIEF DESCRIPTION OF THE DRAWING

The invention will be explained in more detail below using exemplary embodiments. In the drawings.

DETAILED DESCRIPTION OF PREFERRED EMBODIMENTS

For a better understanding of the invention, identical components will be provided with the same reference characters below.

Figure 1:
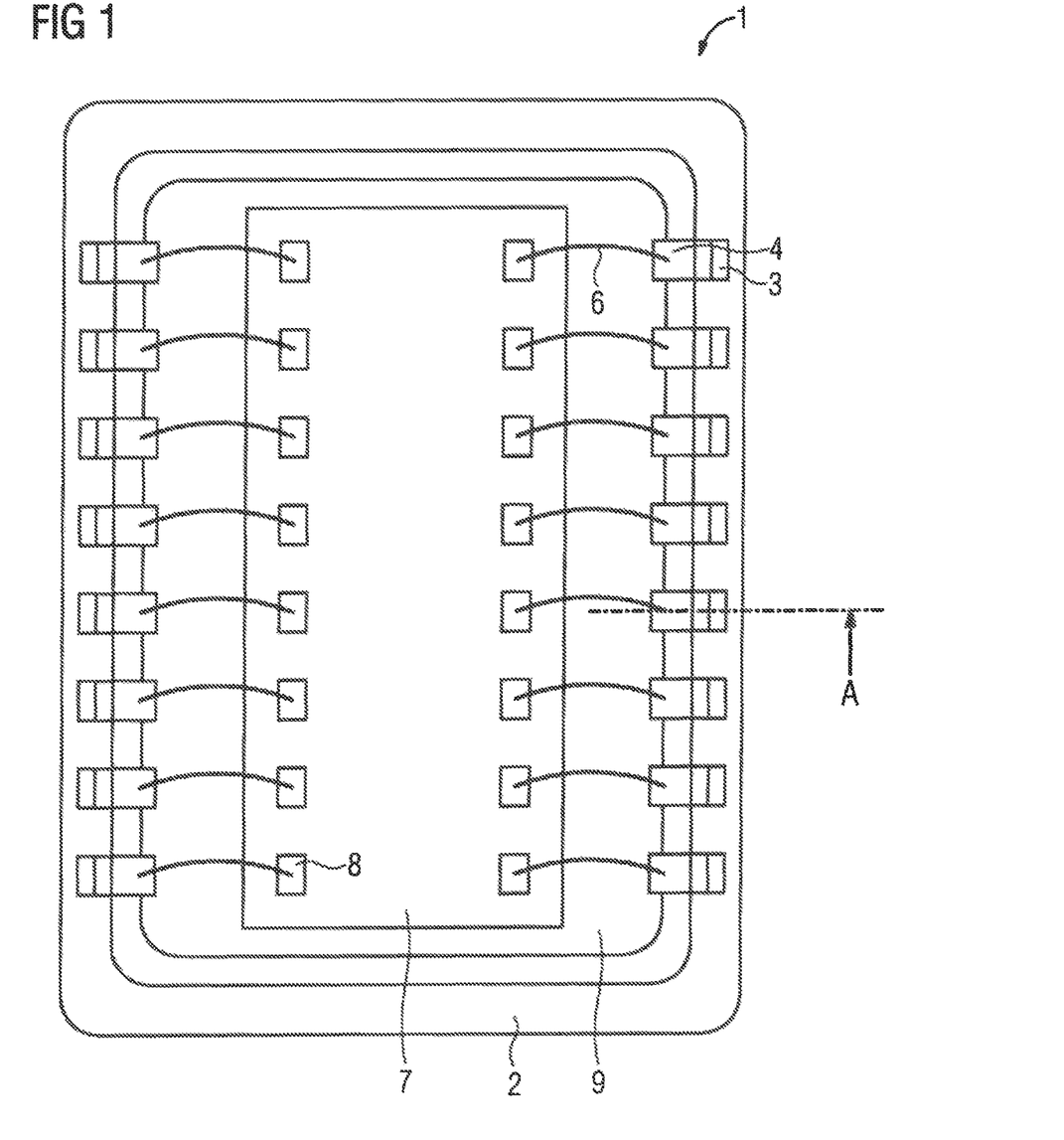
FIG. 1 shows a semiconductor component with an open housing.

FIG. 1 shows an open semiconductor component 1 in a plan view. A series of pins 3 for the semiconductor component 1 to establish electrical contact, for example with a printed circuit board (not represented), is evident to the left and right in each case in a housing part 2, in particular a housing frame part 2. Inserted in the housing frame part 2 is a semiconductor carrier 9, in particular a bottom plate 9, which carries a semiconductor element 7, for example an integrated circuit 7. The semiconductor element 7 is provided on its upper side with semiconductor bonding surfaces 8. Bonding wires 6, which are welded to the bonding surfaces 4, for example in an ultrasonic wire bonding method, are provided for electrical connection of the pins 3, in particular the bonding surfaces 4 of the pins 3, to the semiconductor bonding surfaces 8 of the semiconductor element 7.

The semiconductor component 1 of FIG. 1 can be a conventional semiconductor component according to the prior art as well as an inventive semiconductor component. The invention is not evident from this view.

FIGS. 2-7 show different embodiments of the semiconductor component 1 at a sectional line A evident from FIG. 1.

Figure 2:
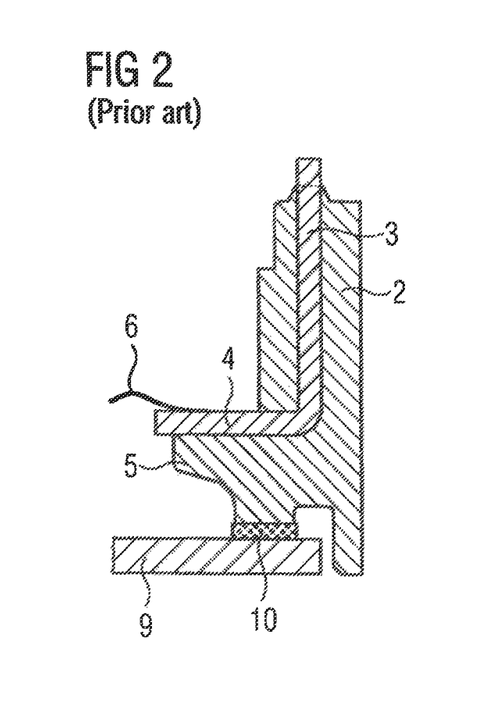
FIG. 2 shows a cross-section of a semiconductor component of FIG. 1 according to the prior art.

FIG. 2 shows a first embodiment for the electrical connection of pins 3 arranged in the housing edge part 2 with the semiconductor element (not represented in FIG. 2) according to the prior art. A bearing surface 5 for the bonding surface 4 is situated underneath the bonding surface 4 for absorbing a force exerted on the bonding surface 4 of the pins 3 during a bonding procedure.

The bonding surface 4 is taken to mean not just the surface of the pin 3 used for bonding but the entire leading region of the pin 3 in which the surface used when bonding is also located.

The bearing surface 5 is usually a shaping or indentation of the housing frame part 2 integrally connected to the housing and made from the same housing material as the rest of the housing frame part 2.

Furthermore, the bottom plate 9 on which the semiconductor element (not represented) is applied is evident from FIG. 2. The bottom plate 9 and the housing frame part 2 are connected together by means of a glued joint, in particular by the adhesive 10.

During the bonding procedure, in particular with ultrasonic wire bonding or ultrasonic welding, for example ultrasonic wedge-wedge bonding, the bonding wire 6 and the bonding surface 4 are welded together by the application of force in connection with ultrasonic vibrations. Under unfavorable circumstances it is possible for resonances to be excited which wholly prevent, or at least prevent in the required quality, the connection between the bonding wire 6 and the bonding surface 4. This is the case, in particular, when housing materials with a high filler content, for example with a high glass fiber content, are used since the resulting housings are harder and therewith less elastic.

Figure 3:
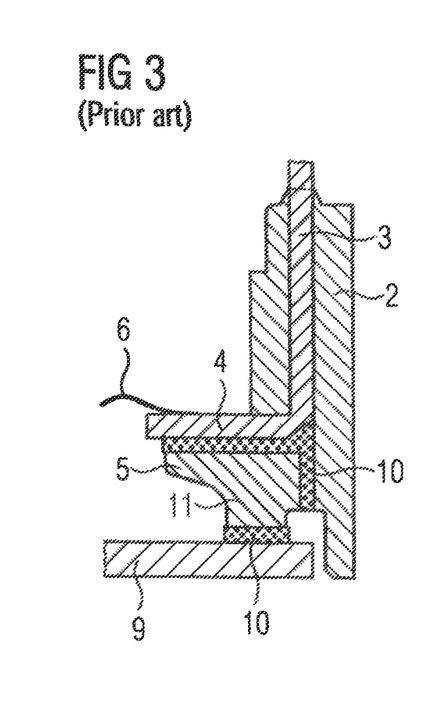
FIG. 3 shows a cross-section of a further semiconductor component of FIG. 1 according to the prior art.

FIG. 3 shows a remedy for this problem, wherein, instead of a one-piece housing frame part, a first housing frame part 2 and a second housing frame part 11 is used in this solution known from the prior art. The two housing frame parts 2 and 11 are produced in separate production processes and are then glued together by applying the adhesive 10 and joining the parts. The entire production process is accordingly much more expensive in this variant than in the one mentioned first. However, this embodiment has the advantage that between the bearing surface 5 and the bonding surface 4, in connection with the gluing of the two housing parts 2 and 11, an adhesive layer 10 can be inserted between the bearing surface 5 and the second housing frame part 11, which layer ensures a soft and elastic mounting of the bonding surface 4. Resonances that occur with ultrasonic wire bonding are thus damped and this results in welded joints of the desired quality.

Figure 4:
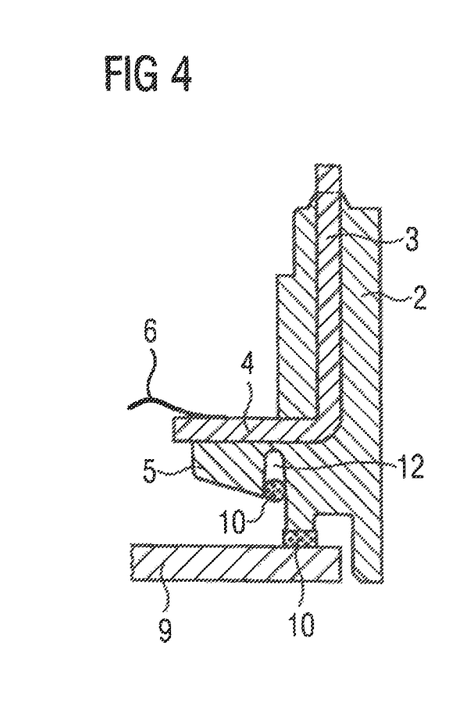
FIG. 4 shows a cross-section of a semiconductor component of FIG. 1 according to the invention.

An inventive embodiment of the relevant housing frame part 2 is now evident from FIG. 4. In contrast to the embodiment of FIG. 3, the housing frame is, however, designed in one piece here due to the housing frame part 2. In order to nevertheless guarantee the desired vibration-damped mounting of the bearing surface 4, a (housing)

recess 12 is provided in the form of a groove 12. This groove 12 ensures that the bearing surface 5 can be elastically resilient.

Damping of the bearing surface 5 is provided in order to effectively suppress undesirable resonances. The damping effect is achieved particularly advantageously in that a vibration-damping material, in particular adhesive 10, is introduced into the groove 12. The consistency of the adhesive 10 is such that the desired damping effect is achieved.

Use of the adhesive 10 for damping also has the advantage that glue 10 has to be applied to the housing frame part 2 in any case, namely for connecting the housing frame part 2 to the bottom plate 9 which carries the semiconductor element (not represented). This means that for the adhesive 10 provided for damping, neither an additional operation for applying the adhesive 10 nor additional installation space in the housing frame part 2 are required.

Particularly advantageously, the material composition of the glue is such that it fulfils both the desired adhesive and vibration-damping effects. One and the same glue can thus be used both as adhesive and as damper.

The force required for ultrasonic bonding is applied perpendicularly to the base area 4 in this embodiment and over the groove 12, which achieves a kind of hinge effect, and deflects the adhesive 10 by 90° and introduces it laterally—in vibration-damped form—into the housing frame part 2.

Figure 5:
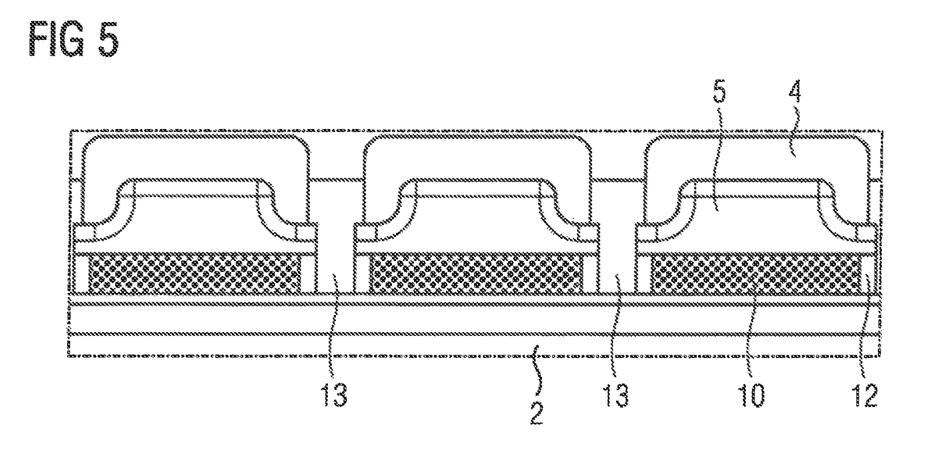
FIG. 5 shows an arrangement of pins located side by side.

FIG. 5 shows an embodiment of the invention of FIG. 4 viewed from the lower side of the housing frame part 2. In contrast to FIG. 4, however, three pins located side by side are represented here, of which in each case the leading end of the bonding surface 4 is evident. The bearing surface 5, the groove 12 and the adhesive 10 introduced into the groove 12 respectively can also be seen in the Figure.

In order to increase the elastic deformability of the bearing surfaces 5 further, the embodiment of FIG. 5 provides that the bearing surfaces 5 of adjacent pins are not directly connected together. In contrast to previous solutions, in which the housing frame part frequently has a continuous "balcony" as a bearing surface for the bonding surfaces of the pins, a gap 13 is provided here in each case between adjacent pins, which separates the bearing surfaces 5 of adjacent pin from one another. Adjacent pins or their bearing surfaces 5 can thus vibrate independently of each other, and this also contributes to damping or preventing undesirable resonances. It should be noted at this point, however, that this embodiment is merely one particular variant of the invention, the lateral gaps 13 are not imperative in many applications, however.

Furthermore, it is noted that the gaps 13 are positioned and oriented in such a way that they can be embodied directly during production of the housing frame part 2. No additional working step is thus required during production of the housing frame part 2 in order to produce the gaps 13.

Figure 6:
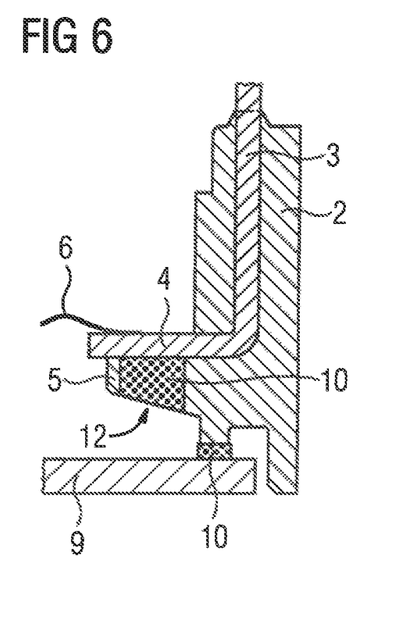
FIG. 6 shows a cross-section of a further embodiment of a semiconductor component according to the invention.

FIG. 6 shows further embodiment of the invention. In contrast to the embodiment of FIG. 5, the recess 12 is not designed in the form of a groove here but as a hole 12 in the bearing surface 5.

In the exemplary embodiment, the hole 12 is continuous and extends to the bonding surface 4 of the pin. Other embodiments, for example as a blind hole, are also possible, however.

A vibration-damping material is also provided here for improved vibration damping. In particular, the hole 12 is filled with adhesive 10.

The hole 12 can be produced in the bearing surface 5 directly during production of the housing frame part 2, in this embodiment of FIG. 6 too, in particular by means of an injection molding method, and can be filled with adhesive 10 in one operation during application of the adhesive 10 for connecting the housing frame part 2 to the bottom plate 9. No additional method steps are thus required in this embodiment either compared to the method steps that are in any case required during production. The intended effect can therefore also be achieved particularly efficiently and inexpensively here.

Figure 7:
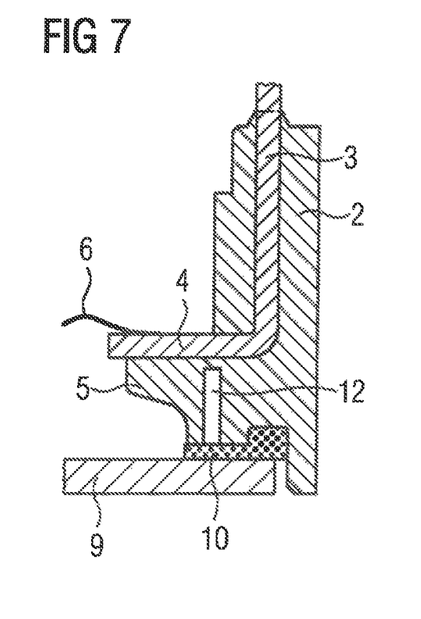
FIG. 7 shows a cross-section of a further embodiment of a semiconductor component according to the invention and FIG. 8 shows method steps when executing an inventive method.

FIG. 7 shows a further embodiment of the invention. Here too—similar to the embodiment of FIG. 4—a groove 12 is formed underneath the bearing surface 4. In contrast to the embodiment of FIG. 4, in the embodiment of FIG. 7 the damping material in the form of the adhesive 10 is not applied directly into the groove, however, and instead the adhesive 12 is situated here in a gap between the housing frame part 2 and the bottom plate 9 in a region (immediately) adjoining the groove 12.

This embodiment offers the advantage that even less ultrasonic energy reaches the housing frame part 2 since it is at least partially diverted to the bottom plate 9 by the connection between the housing frame part 2 and the bottom plate 9.

In addition, it can be difficult in terms of dispensing to introduce the adhesive 10 into the recess or groove 12 in the case of narrow recesses or grooves. With the solution of FIG. 7 the adhesive 12 can be applied to the housing frame part 2 in a relatively wide track and therewith easily in terms of dispensing. The damping effect, which results from the combination of groove and damping material, can thus be achieved especially easily, in particular without additional or complicated method steps during production.

The damping can also be advantageously adjusted via the layer thickness of the adhesive layer here.

Figure 8:
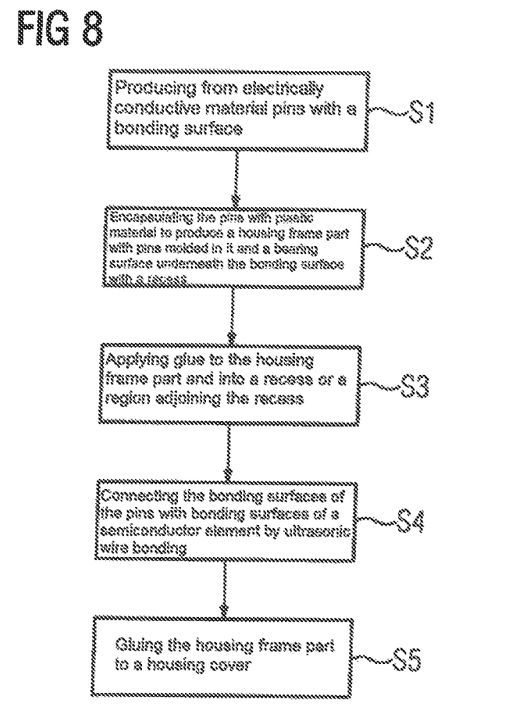

FIG. 8 shows method steps required during the production of an inventive semiconductor component:

In a first method step S1, pins provided with a bonding surface in each case are produced from an electrically conductive material.

In a second method step S2, the pins are encapsulated with plastic material, in particular by means of an injection molding method, in such a way that a housing frame part with pins molded in it is produced, with the housing frame part being constructed in such a way that a bearing surface formed underneath the bonding surface of a pin is provided with a recess, in particular a groove.

In a third method step S3, glue is applied to the housing frame part and glue is introduced into the recess as a damping material or glue applied in a region adjoining the recess. The housing frame part and a bottom plate, which carries at least one semiconductor element, are then joined and glued together by means of the previously applied adhesive.

In a fourth method step S4, the bonding surfaces of the pins are connected together, in particular welded, with bonding surfaces of the semiconductor element by means of an ultrasonic wire bonding method.

In a fifth method step S5, the housing frame part is glued to a housing cover.

The invention claimed is:

1. A housing part for accommodating a semiconductor element, the housing part comprising:
a pin partially molded in the housing part for electrical connection to a printed circuit board, said pin comprising a bonding surface for producing an electrical connection between the pin and the semiconductor element;

a bearing surface for the bonding surface, wherein the housing part comprises the bearing surface for the bonding surface;

a recess formed in the bearing surface, wherein the housing part has the recess in the bearing surface; and a vibration-damping material at least partially filled in the recess and/or applied in a region adjoining the recess, wherein the housing part is designed as a one-piece housing frame part.

2. The housing part of claim 1, wherein the recess is embodied as a groove between the bearing surface and a rest of the housing part.

3. The housing part of claim 1, wherein the bonding surface is embodied at one end of the pin, said pin having a bend of at least approximately 90° between the bonding surface and a contact surface arranged at an opposing end of the pin.

4. The housing part of claim 1, wherein the vibration-damping material is an adhesive.

5. The housing part of claim 1, wherein the housing part comprises a plurality of said pin arranged directly side by side and each comprising a bonding surface and a bearing surface, with adjacent bearing surfaces being separated from one another by a gap.

6. The housing part of claim 1, further comprising a plastic, in particular epoxy resin, which is filled with a filler, in particular particles or glass fibers.

7. A semiconductor component, comprising:

a semiconductor element; and a housing part accommodating the semiconductor element and comprising a pin partially molded in the housing part for electrical connection to a printed circuit board, said pin comprising a bonding surface for producing an electrical connection between the pin and the semiconductor element, a bearing surface for the bonding surface, wherein the housing part comprises the bearing surface for the bonding surface, a recess formed in the bearing surface, wherein the housing part has the recess in the bearing surface, and a vibration-damping material at least partially filled in the recess and/or applied in a region adjoining the recess, wherein the housing part is designed as a one-piece housing frame part.

8. The semiconductor component of claim 7, embodied as a Wide Band Gap semiconductor, in particular SiC MOSFET, or an Insulated-Gate Bipolar Transistor.

9. The semiconductor component of claim 7, wherein the recess is embodied as a groove between the bearing surface and a rest of the housing part.

10. The semiconductor component of claim 7, wherein the bonding surface is embodied at one end of the pin, said pin having a bend of at least approximately 90° between the bonding surface and a contact surface arranged at an opposing end of the pin.

11. The semiconductor component of claim 7, wherein the vibration-damping material is an adhesive.

12. The semiconductor component of claim 7, wherein the housing part comprises a plurality of said pin arranged directly side by side and each comprising a bonding surface and a bearing surface, with adjacent bearing surfaces being separated from one another by a gap.

13. The semiconductor component of claim 7, wherein the housing part comprises a plastic, in particular epoxy resin, which is filled with a filler, in particular particles or glass fibers.

14. A method, comprising:

at least partially molding a pin in a housing part for electrical connection to a printed circuit board;

electrically connecting a bonding surface on the pin between the pin and a semiconductor element;

forming a bearing surface for the bonding surface, wherein the housing part comprises the bearing surface for the bonding surface;

forming a recess in the bearing surface, wherein the housing part has the recess in the bearing surface;

at least partially filling the recess with a vibration-damping material and/or applying the vibration-damping material in a region adjoining the recess, wherein the housing part is designed as a one-piece housing frame part.

15. The method of claim 14, wherein the recess is embodied as a groove.

16. The method of claim 14, wherein the recess is produced in an injection molding method during production of the housing part.

17. The method of claim 14, further comprising introducing an adhesive into the recess as the vibration-damping material.

18. The method of claim 14, further comprising:

applying the semiconductor element to a semiconductor carrier;

applying an adhesive to the housing part for connecting the semiconductor carrier to the housing part;

introducing the adhesive in a same operation into the recess; and gluing the semiconductor carrier to the housing part via the adhesive.

19. The method of claim 14, further comprising connecting a semiconductor bonding surface of the semiconductor element and the bonding surface to one another by wire bonding, in particular ultrasonic wire bonding, in particular ultrasonic wedge-wedge bonding.

20. The method of claim 14, for producing the semiconductor component as set forth in claim 7.

* * * * *